(12) United States Patent
Roehr (10) Patent No.: US 7,257,013 B2
(45) Date of Patent: Aug. 14, 2007

(54) METHOD FOR WRITING DATA INTO A MEMORY CELL OF A CONDUCTIVE BRIDGING RANDOM ACCESS MEMORY, MEMORY CIRCUIT AND CBRAM MEMORY CIRCUIT

(75) Inventor: Thomas Roehr, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/222,282

(22) Filed: Sep. 8, 2005

(65) Prior Publication Data

US 2007/0058417 A1 Mar. 15, 2007

(51) Int. Cl.
*G11C 11/00* (2006.01)
(52) U.S. Cl. .............. 365/148; 365/189.02; 365/189.09
(58) Field of Classification Search ................ 365/148, 365/189.02, 189.09
See application file for complete search history.

(56) References Cited

U.S. PATENT DOCUMENTS

| | | | |
|---|---|---|---|
| 6,731,528 B2 * | 5/2004 | Hush et al. .................. | 365/100 |
| 6,865,117 B2 | 3/2005 | Kozicki | |
| 6,873,538 B2 * | 3/2005 | Hush .......................... | 365/148 |
| 6,888,773 B2 * | 5/2005 | Morimoto .................... | 365/218 |
| 6,909,656 B2 * | 6/2005 | Moore et al. ................. | 365/222 |
| 6,961,277 B2 * | 11/2005 | Moore et al. ................. | 365/222 |
| 2002/0154531 A1 | 10/2002 | Lowrey et al. | |
| 2006/0050547 A1 * | 3/2006 | Liaw et al. .................. | 365/148 |

FOREIGN PATENT DOCUMENTS

| | | |
|---|---|---|
| EP | 1306852 | 5/2003 |
| EP | 1326258 | 7/2003 |
| EP | 1426974 | 6/2004 |
| EP | 1450343 | 8/2004 |

OTHER PUBLICATIONS

M.N. Kozicki, M. Mitkova, J. Zhu, M. Park, and C. Gopalan, "Can Solid State Electrochemistry Eliminate The Memory Scaling Quandary?" Extended Abstracts of the 2002 IEEE Silicon Nanoelectronics Workshop, Honolulu, HI, Jun. 2002.

* cited by examiner

*Primary Examiner*—Hoai V. Ho
(74) *Attorney, Agent, or Firm*—Patterson & Sheridan, L.L.P.

(57) ABSTRACT

The present invention refers to a method for writing data into a memory cell of a conductive bridging random access memory and to a memory circuit comprising memory cells with programmable metallization cells, particularly a CBRAM memory circuit. The embodiments of the prevent invention provide a method and a memory circuit for holding adjacently arranged bit lines at writing voltages during a writing operation of a selected memory cell to reduce voltage crosstalk.

23 Claims, 3 Drawing Sheets

METHOD FOR WRITING DATA INTO A MEMORY CELL OF A CONDUCTIVE BRIDGING RANDOM ACCESS MEMORY, MEMORY CIRCUIT AND CBRAM MEMORY CIRCUIT

BACKGROUND OF THE INVENTION

1. Field of the Invention

The present invention refers to a method for writing data into a memory cell of a conductive bridging random access memory and to a memory circuit comprising memory cells with programmable metallization cells, particularly a CBRAM memory circuit.

2. Description of the Related Art

Memory cells comprising a solid electrolyte material are well known as PMC (programmable metallization cell) memory cells. Memory devices including such PMC memory cells are known as CBRAM (conductive-bridging random access memory) devices. The storing of different states in a PMC memory cell is based on the developing or diminishing of a conductive path in the electrolyte material between electrodes based on an applied electrical field. Although the electrolyte material has a high resistance, the conductive path between electrodes has a low resistance. Thereby, the PMC memory cell can be set to different states depending on the resistance of the PMC memory element. Usually, both states of the PMC memory cell are sufficiently time-stable in such a way that data may permanently be stored.

A PMC memory cell is operated by applying a positive or a negative voltage to the solid electrolyte of the PMC memory element. In order to store data into the PMC memory cell, the PMC memory cell is brought to a programmed stated by applying a suitable programming voltage to the PMC memory cell which results in the development of the conductive path in the electrolyte material and therefore in the setting of a first state with low resistance. In order to store a second state in the PMC memory cell with high resistance, an erase voltage has to be supplied in such a manner that the resistance of the PMC memory cell changes back to a high resistance which refers to an erased state. To read out a PMC memory cell, a read voltage is applied that is lower than the programming voltage. With the read voltage, a current through the resistance of the PMC memory element is detected and associated to the respective low or high resistance state of the PMC memory cell.

U.S. Pat. No. 6,865,117 B2 describes a programming circuit for a programmable microelectronic device, a system including the circuit and a method for forming the same. The circuit is configured to provide a reversible bias across the microelectronic device to perform erase and write functions. One configuration of the programming circuit includes one or more inputs and a complementary metal-oxide semiconductor (CMOS) circuit coupled to the programmable device. This design allows for writing and erasing of the programmable cell using a low and a high voltage input. Depending on the state that should be programmed into the PMC cell, a high voltage is applied to the anode and a low voltage is applied to the cathode or, reversely, a low voltage is applied to the anode and a high voltage is applied to the cathode of the PMC cell. However, voltage crosstalk might occur between the high voltage level of a selected bit line, used for programming a selected PMC cell, and a non-selected (or floating) neighboring bit line that could cause a programming failure. Therefore, there is a need for a method and a memory circuit that allow writing data in a memory cell of a CBRAM with reduced sensitivity to voltage crosstalk between bit lines during the programming operation.

SUMMARY OF THE INVENTION

The present invention refers to a method for writing data into a memory cell of a conductive bridging random access memory and to a memory circuit comprising memory cells with programmable metallization cells, particularly a CBRAM memory circuit. One embodiment of the present invention provides a method of writing a datum in a memory cell of a conductive bridge random access memory (CBRAM), comprising a plate line, at least three bit lines that are disposed side by side, and at least three memory cells with a programmable metallization cell (PMC) in each of the at least three memory cells, and each of the at least three memory cells is connected to a respective bit line of the at least three bit lines and the plate line. The method comprises applying to a selected bit line, that is connected to a selected memory cell, a writing voltage for the selected memory cell to write a datum in the selected memory cell to change the resistance value of a selected PMC of the selected memory cell, applying to a first neighboring bit line of the selected bit line, wherein the first neighboring bit line is connected to a first neighboring memory cell of the selected memory cell, a writing voltage of the first neighboring memory cell corresponding to a datum stored in the first neighboring memory cell so that data are written in the selected and the first neighboring memory cells during the writing operation of the selected memory cell to reduce voltage crosstalk between the selected bit line and the first neighboring bit line, and applying to a second neighboring bit line of the selected bit line, wherein the second neighboring bit line is connected to a second neighboring memory cell of the selected memory line, a writing voltage of the second neighboring memory cell corresponding to a datum stored in the second neighboring memory cell, so that data are written in the selected, the first neighboring, and the second neighboring memory cells during the writing operation of the selected memory cell to reduce voltage crosstalk between the selected bit line, the first neighboring bit line, and the second neighboring bit line.

Another embodiment of the present invention provides a conductive bridge random access memory (CBRAM) circuit that comprises a plate line, at least two bit lines that are disposed side by side, at least two memory cells, wherein each of the at least two memory cells comprises a programmable metallization cell (PMC) with a solid electrolyte which is adapted to develop or diminish a conductive path depending on the applied electrical field across the PMC, and the each of the at least two memory cells is connected to a bit line of the at least two bit lines and the plate line, a writing unit, wherein the writing unit is connected to the at least two bit lines, and is configured to change a resistive state of a selected PMC of a selected memory cell of the at least two memory cells to a programmed or erased state by applying a writing voltage for a selected PMC to a selected bit line of the at least two bit lines and the selected bit line is connected to the selected PMC, comprising a controlling unit, configured to control the writing unit to apply a writing voltage for the select PMC to the selected bit line and to apply a writing voltage of at least one neighboring PMC to at least one neighboring bit line of the selected bit line that corresponds to a stored datum of the at least one neighboring PMC, connected to the at least one neighboring bit line, during the writing operation of the selected memory cell, and an output unit that is connected with the at least two bit lines for reading out data from the at least two memory cells.

Another embodiment of the present invention provides a memory circuit that comprises a plate line, at least three bit lines that are disposed side by side, a word line, at least three memory cells and each of the at least three memory cell has a programmable metallization cell (PMC) with a solid electrolyte which is adapted to develop or diminish a conductive path depending on the applied electrical field across the PMC, and a switch that is connected to one respective bit of the at least three bit lines, wherein a controlling input of the switch is connected to the word line, a cathode of the PMC is connected to the plate line, and an anode of the PMC is connected to the switch, and a writing unit, wherein the writing unit is connected to the at least three bit lines and is configured to change a resistive state of a selected PMC to a programmed or erased state by applying a writing voltage for a selected PMC to a selected bit line that is connected to the selected PMC and is the middle bit line of the at least three bit lines with one first neighboring bit line on one side and one second neighboring bit line on the other side, comprising a controlling unit, configured to control the writing unit to apply a writing voltage for the select PMC to the selected bit line, to apply a writing voltage of the first neighboring memory cell that is connected to the first neighboring bit line to the first neighboring bit line that corresponds to a stored datum of a the first neighboring memory cell, and to apply a writing voltage of the second neighboring memory cell that is connected to the second neighboring bit line to the second neighboring bit line that corresponds to a stored datum of a the second neighboring memory cell.

Yet another embodiment of the present invention provides a memory circuit that comprises at least two bit lines that are disposed side by side, at least two memory cells disposed side by side with each of the at least two memory cells connected to a respective bit line of the at least two bit lines, and means of writing a datum to a selected memory cell of the at least two memory cells, wherein during writing the datum to the selected memory cell, the neighboring memory cells of the selected memory cell are written during the same writing operation with data that were stored in the neighboring memory cells prior to the writing operation to reduce voltage crosstalk between the bit lines during the writing operation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention provide a method and a memory circuit for holding adjacently arranged bit lines at the writing voltages corresponding to the data stored or corresponding to the data that should be written in the memory cells therein during a writing operation to reduce voltage crosstalk. The concept of the invention can be used in any memory circuit, particularly in a CBRAM memory circuit.

The present invention may be described in terms of various functional components. It should be appreciated that such functional components may be realized by any number of hardware or structural components configured to perform the specified functions. For example, the present invention may employ various integrated components comprised of various electrical devices, e.g. resistors, transistors, capacitors, diodes and such like, the values of which may be suitably configured for various intended purposes. In addition, the present invention may be practiced in any integrated circuit application where an effective reversible polarity is desired. Such general applications which may be appreciated by those skilled in the art in light of the present disclosure are not described in detail. Further, it should be noted that while various components may be suitably coupled or connected to other components within exemplary circuits, such connections and couplings can be realized by direct connection between components and by connection through other components and devices located in between.

The present invention generally relates to a method for operating a programmable metallization cell of a conductive bridging random access memory (CBRAM), an electrical circuit comprising a PMC cell with a solid electrolyte and a CBRAM memory cell comprising programmable metallization cells.

Figure 1:
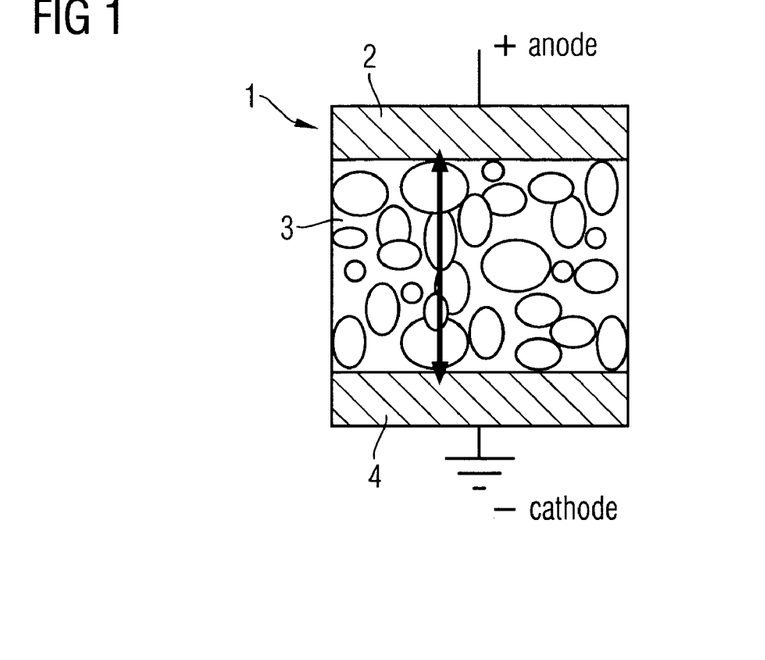
FIG. 1 is a schematic view of a PMC cell.

In a schematic view, FIG. 1 depicts a conductive bridging junction of a PMC cell 1 comprising an anode 2, a cathode 4 and an electrolyte layer 3 in between. The cathode 4 is connected to a ground potential and the anode 2 may be connected to a high potential in the depicted situation that shows a programming operation.

The structure shown in FIG. 1 may be used in order to store information and thus may be used in memory circuits. For example, the conductive bridging junction or other programmable structure in accordance with the present invention may be suitably used in memory devices to replace DRAM, SRAM, PROM, EEPROM, flash devices or any combination of such memories. In addition, programmable structures of the present invention may be used for other applications where programming or changing of electrical properties of a portion of an electrical circuit are desired.

The electrolyte layer 3 is formed by material which conducts ions upon application of a sufficient voltage. Suitable materials for ion conductors include polymers, glasses and semiconductor materials. In one exemplary embodiment of the invention, the electrolyte layer 3 is formed by chalcogenides material. The electrolyte layer 3 may also suitably include dissolved and/or dispersed conductive material. For example, the electrolyte layer 3 may comprise a solid solution that includes dissolved metals and/or metal ions. The chalcogenides materials including silver, copper, combinations of these materials and such like could be used for constituting the electrolyte layer 3.

The anode 2 and the cathode 4 may be formed by any suitable conductive material. For example, the anode 2 and the cathode 4 may be formed by doped polysilicon material or metal. In accordance with one exemplary embodiment of the present invention, one of the electrodes, i.e. the anode 2, is formed by a material including a metal which dissolves in ion conductors when a sufficient bias is applied across the electrodes and the other electrode, i.e. the cathode is relatively inert and does not dissolve during operating of the programmable device. The first electrode 2 may be an anode during a write operation and be comprised of a material including silver which dissolves in the electrolyte layer. The second electrode 4 may be a cathode during the write operation and be comprised of an inert material such as tungsten, nickel, molybdenum, platinum, metal silicides, and such like.

The conductive bridging junction is configured in such a way that when a bias larger than a threshold voltage is applied across the electrodes 2, 4, the electrical properties of the electrolyte layer 3 change. If a voltage is applied larger than the threshold voltage, conductive ions within the electrolyte layer start to migrate and to form a region having an increased conductivity compared to the conductor at or near the more negative of the electrodes 2, 4. As the conductive region forms, the resistance between the electrodes 2, 4 decreases and other electrical properties may also change. If the same voltage is applied in reverse, the conductive region will dissolve back into the electrolyte layer and the device will return to a high resistance or erased state.

The basic reaction is if a higher voltage is applied at the anode 2, a redox reaction at the cathode 4 drives metal ions from the reactive anode into the electrolyte layer 3. Therefore, in the electrolyte layer 3, metal-rich clusters are formed. The result is a conductive bridge that occurs between the anode and the cathode. If a reverse voltage is applied to the PMC cell 1, the metal-rich clusters are dissolved and the conductive bridge is degraded.

Figure 2:
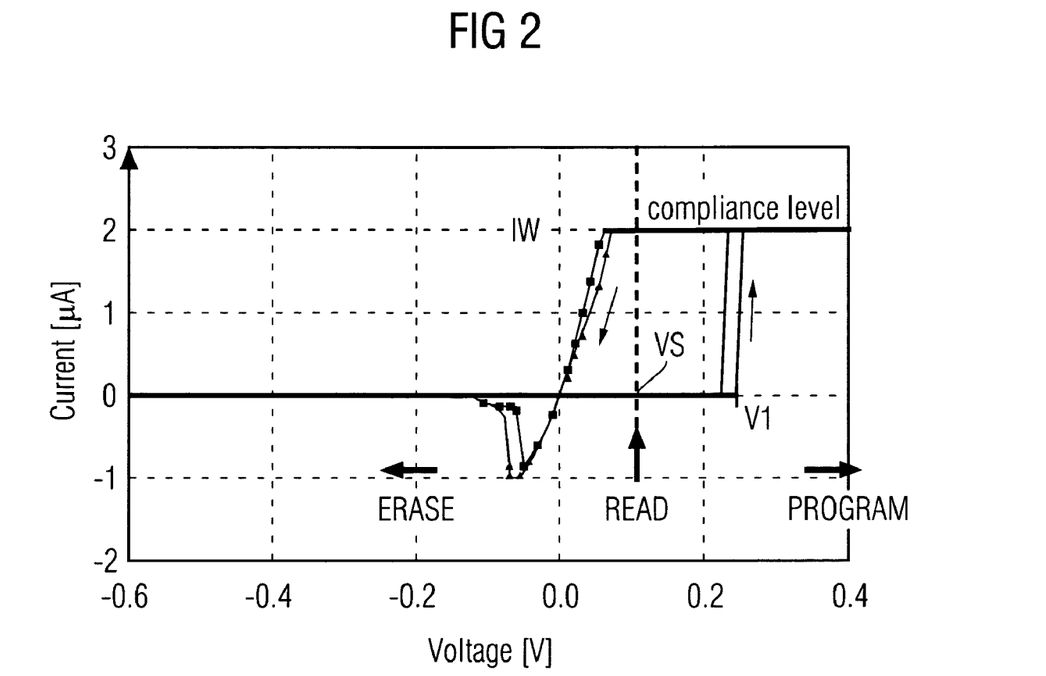
FIG. 2 shows a diagram of the current depending on the voltage drop over the PMC cell during programming, reading and erasing operation.

FIG. 2 shows a diagram of the voltage and the current occurring during a programming operation, a read operation and an erase operation of a PMC cell 1, whereby the programming and the erasing operation constitute writing operations which are used to store a datum in a memory cell. Initially, it can be assumed that the PMC cell is not programmed and therefore has a high resistance and a corresponding low current. If a voltage is applied with a higher voltage at the anode 2 and a lower voltage at the cathode 4, no current flows through the PMC cell 1 until a threshold voltage $V_T$, for example 0.23 volt, is applied. With the programming voltage $V_P$ rising over the threshold voltage $V_T$, current starts to flow until a working current $I_W$, for example 2 μA, is achieved which is determined by the programming circuit. The voltage is then reduced to 0 volt, and the current falls to 0 A. Now the PMC cell 1 is programmed.

If the program status is to be sensed or read, a sensing voltage $V_S$, which is lower than the threshold voltage $V_T$, is applied to the PMC cell 1. For example, the sensing voltage $V_S$ may be about 0.1 volt. Due to the sensing voltage $V_S$, a working current $I_W$ flows through the PMC cell 1. Without the previous programming operation, no current would flow through the PMC cell 1 when a sensing voltage $V_S$ is applied to the cell. To erase the program status, a lower voltage, i.e. a negative voltage, is applied to the anode 2 starting at 0 volt. Up to an erase voltage $V_E$, for example a negative voltage of about −0.1 Volt, a negative current flows through the PMC cell 1. But when the negative voltage drops below the erase voltage $V_E$, for example below −0.1 volt, the current goes down to 0 A. Now the PMC cell 1 again has the same high resistance as prior to the programming operation.

Figure 3:
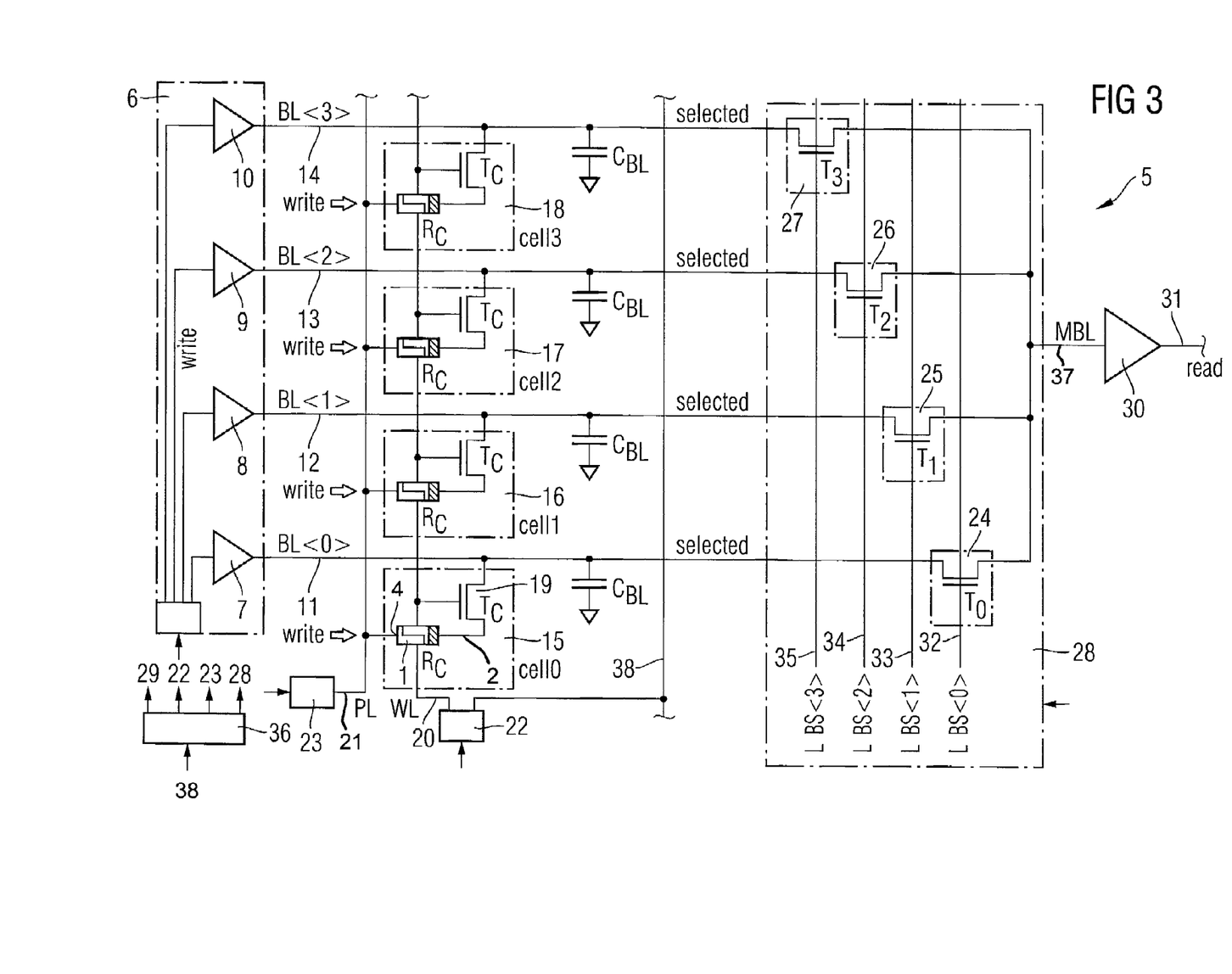
FIG. 3 depicts a part of a CBRAM memory.

FIG. 3 depicts a part of an electrical circuit, e.g. a CBRAM 5. The electrical circuit comprises memory cells 15, 16, 17, 18, and each memory cell comprises a PMC cell 1 (see memory cell 16 of FIG. 3) and a switch 19. A cathode 4 of a PMC cell 1 is connected to a plate line 21 and an anode 2 of a PMC cell 1 is connected to a switch 19. A switch 19 is connected to one of the bit lines 11, 12, 13, 14, and a controlling input of a switch 19 is connected to a word line 20. In one embodiment, the switches 19 is constituted by field effect transistors which connect the PMC cells 1 to respective bit lines 11, 12, 13, 14 depending on the voltage of the word line 20. In FIG. 3, only one row of memory cells is depicted, however, several word lines could be disposed whereas each word line is connected to a row of memory cells.

The plate line 21 is connected to a plate line driver 23. The word line 20 is connected to a word line driver 22. The first, the second, the third and fourth bit lines 11, 12, 13, 14, respectively, are connected to a writing unit 6 and a multiplexing unit 28. The writing unit 6 comprises a controlling unit 29 and a first, a second, a third and a fourth amplifier 7, 8, 9, 10, respectively, which are connected to the respective first, second, third or fourth bit line 11, 12, 13, 14 (see FIG. 3).

The second endings of the first, second, third, fourth bit line 11, 12, 13, 14 are connected to first, second, third, and fourth switches 24, 25, 26, 27, respectively, which are part of the multiplexing unit 28. Outputs of the switches 24, 25, 26, 27 are connected to an output 37 of the multiplexing unit 28. The output 37 of the multiplexing unit 28 is connected to an output unit 30. In one embodiment, the output unit 30 comprises an amplifier and a sensing unit and an output 31.

Each switch 24, 25, 26, 27 comprises a controlling input which is connected to one of the controlling lines 32, 33, 34, 35, respectively (see FIG. 3). Depending on the voltage on the controlling lines, the switches 24, 25, 26, 27 connect the bit lines 11, 12, 13, 14 to the output unit 30. In one embodiment, the switches 24, 25, 26, 27 are constituted of n-channel field effect transistors.

In one embodiment of the invention, each bit line 11, 12, 13, 14 is connected to a respective output unit 30. Thus, a multiplexing unit 28 is not necessary. However, under the circumstance, the number of output units 30 would correspond to the number of bit lines 11, 12, 13, 14.

Furthermore, in one embodiment of the invention, a separate writing unit 6 may be disposed for each bit line 11, 12, 13, 14, and the separate writing units 6 are controlled by a common controlling unit 29. The writing unit 6 is configured to raise or to lower the voltage on the first, the second, the third or the fourth bit line 11, 12, 13, 14, depending on controlling signals of the controlling unit 29. This is necessary for writing data into the memory cells 15, 16, 17, 18. The plate line driver 23 is configured to raise or to lower the voltage on the plate line 21. The voltage on the plate line 21 may be used to increase the voltage drop over the PMC cell of a memory cell. The word line driver 22 is configured to increase or to decrease a voltage on the word line. If, for example, n-channel field effect transistors are used as switches 19 for the memory cells 15, 16, 17, 18, the anodes of the PMC cells 1 of the memory cells 15, 16, 17, 18 may be connected with the respective first, second, third, fourth bit line 11, 12, 13, 14 by increasing the voltage on the word line 20.

Furthermore, the CBRAM 5 comprises a central unit 36 which is connected to the controlling unit 29, the word line driver 22, the plate line driver 23 and the multiplexing unit 28. The central unit 36 comprises an input 38 for receiving instructions that controls the writing and reading of data to and from the memory cells 15, 16, 17, 18.

If the central unit 36 receives the instruction to write a datum into the second memory cell 16, the central unit 36 sends a respective writing signal to the controlling unit 29 of the writing unit 6. If a datum "1" has to be written into the second memory cell 16, the controlling unit 29 controls the second amplifier 8 in such a way that the second amplifier 8 applies a high voltage on the second bit line 12. The high voltage may be higher than the threshold voltage $V_T$ of the PMC cell of the second memory cell 16. Additionally, the central unit 36 sends a control signal to the word line driver 22 that the word line 20 has to be set to a high voltage in order to close the switches 19 of the first, the second, the third and the fourth memory cells 15, 16, 17, 18, connecting the memory cells to the respective first, second, third, and fourth bit lines 11, 12, 13, 14.

In addition, the controlling unit 29 also sends a controlling signal to the first, the third, the fourth amplifier 7, 9, 10 in order to apply a writing voltage to the respective first, third and fourth bit line 11, 13, 14, although only a datum should be written into the second memory cells 16. The writing voltage of the first, third and fourth bit line 11, 13, 14 corresponds to the data that are stored in the first, third and fourth memory cells 15, 17, 18. If a datum "0" is stored, an erase voltage is applied and if a datum "1" is stored, a program voltage $V_P$ is applied to the respective bit line. This writing operation has the advantage that the adjacent bit lines 11, 12, 13, 14 are at the writing voltage level at the same time that corresponds to the data stored in their memory cells. Thus, crosstalk has less impact during the writing operation. In a further embodiment of the invention data are always written at the same time into memory cells 15, 16, 17, 18, which are connected to bit lines that are arranged adjacent. Although in this method a writing voltage is put on the adjacent bit lines 11, 12, 13, 14 and this reduces the risk of a crosstalk that damages the voltages of the adjacent bit lines 11, 12, 13, 14.

For reading out data from a second memory cell 16, the central unit 36 sends a read signal to the controlling unit 29, the word line driver 22 and the multiplexing unit 28. If the datum of the second memory cell 16 is to be read, the controlling unit 29 controls the second amplifier 8 in such a way that the second amplifier 8 puts a reading voltage $V_R$ on the second bit line 12 which is lower than the threshold voltage required for programming the PMC cell. Additionally, the word line driver 22 applies a high voltage to the word line 20 to close the switches 19 of the first, second, third and fourth memory cell 15, 16, 17, 18. Additionally, the multiplexing unit 28 puts a high level signal on the second controlling line 33 closing the switch 25. Therefore, the sensing unit 30 connected to the output of the multiplexing unit 28 senses a small or a high current depending on the resistance state of the PMC cell 1 of the second memory cell 16. Depending on the value of the current, the sensing unit 30 detects a low or a high resistance, i.e. "0" or "1" stored in the second memory cell 16. A respective current value is given out by the sensing unit 30 by the further output 31.

The use of the multiplexing unit 28 has the advantage that one output unit 30 is used for several bit lines. Thus, area is spared on the CBRAM 5.

The writing operation and the reading operation of data into or out of the first, the third and the fourth memory cell 15, 17, 18 is the same as explained above for the second memory cell 16. The difference is merely that the writing unit 6 activates the respective amplifiers and the multiplexing unit 28 closes the respective switches in the multiplexing unit 28 by reading data from the first, the third or the fourth memory cell 15, 17, 18. During the writing operation, at least the neighboring bit lines, of the bit line of the memory cell into which a datum should be written, are put to a writing voltage corresponding to the data stored in their memory cells or corresponding to data that should be written in the memory cells. Thus, the influence of voltage crosstalk between neighboring bit lines is reduced.

In addition to the described writing and reading operations, the voltage on the plate line 21 may also be changed during a writing and/or reading operation of data of memory cells 15, 16, 17, 18. Particularly during programming a datum in a memory cell, a high voltage drop should be generated across the PMC cell of the respective memory cell. Therefore, it may be advantageous not only to increase the voltage of the bit line of the respective memory cell, but also to decrease the voltage on the plate line 21 in order to increase the voltage drop over the PMC cell of the respective memory cell.

Figure 4:
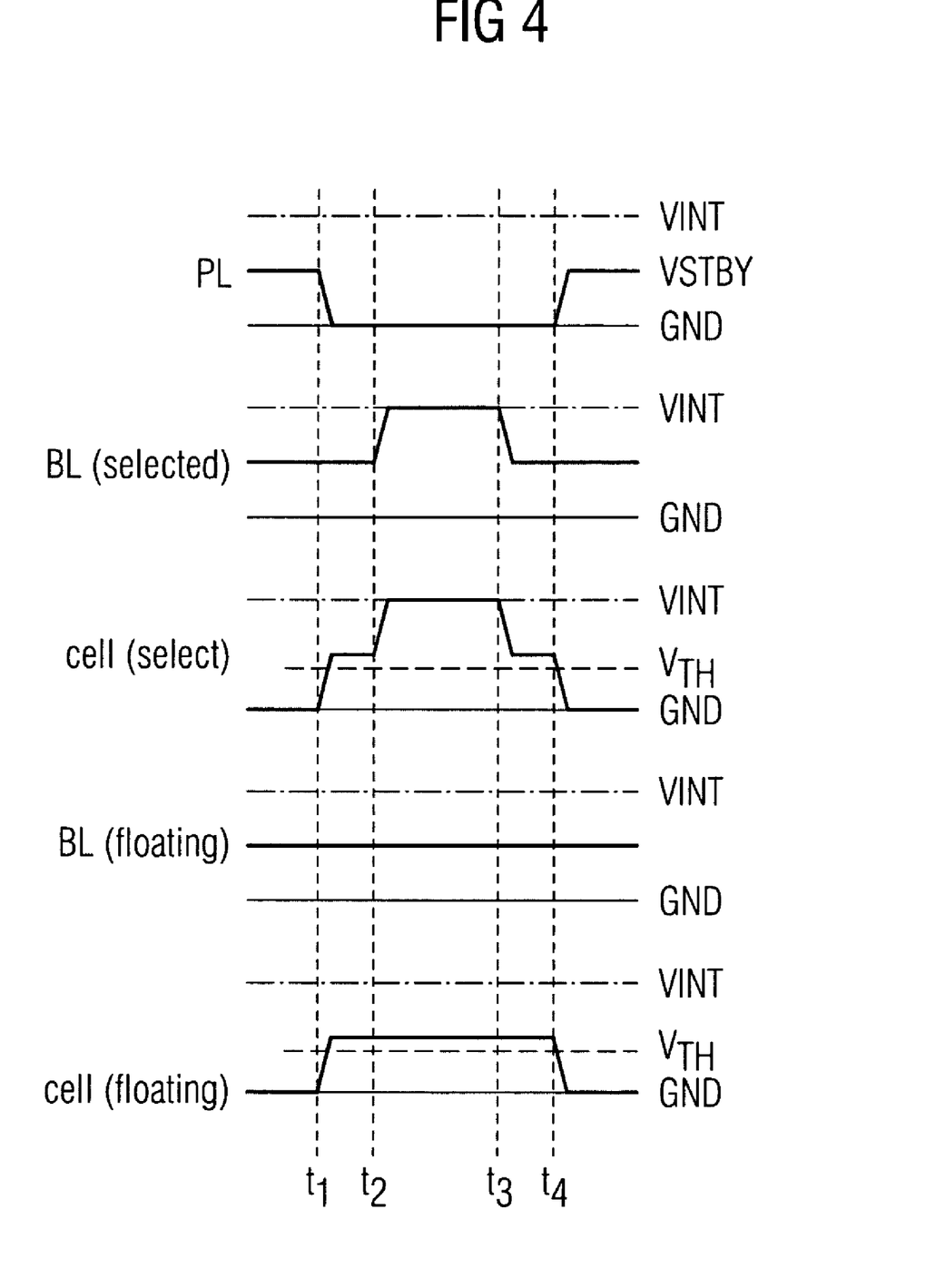
FIG. 4 shows a diagram of voltages of various components of a CBRAM cell as a function of time during a programming operation of a selected PMC cell

FIG. 4 depicts a diagram of the plate line (PL) voltage, the voltage of a selected bit line (BL) and the voltage drop of a selected PMC cell that is connected to the selected bit line. Furthermore, a voltage behavior of an unselected bit line according to the state of the art that floats is depicted as floating BL, and the voltage drop across an unselected PMC cell is depicted as floating cell. The selected and the unselected bit lines are arranged side by side.

At a first point of time $t_1$, the voltage on the plate line 21 is lowered from a standby voltage $V_{STBY}$ to ground $V_{GND}$. Additionally, the voltage of the word line is at a high level, thus resulting in a closed switch of the memory cell. The voltage of the word line is not depicted in FIG. 4. The lowering of the voltage on the plate line causes an increase of the voltage drop across the PMC cell of the selected memory cell as the voltage on the selected bit line is at this time in the region of a standby voltage $V_{STBY}$. At a second point of time $t_2$, the writing unit 6 raises the voltage applied to the selected bit line up to the internal voltage $V_{INT}$. This results in a higher voltage drop over the selected PMC cell. The voltage drop over the selected PMC cell is higher than the voltage threshold, $V_T$, necessary to program the PMC cell from a high to a low resistive state. Setting the voltage of the plate line to the ground voltage $V_{GND}$ and setting the selected bit line to the high internal voltage $V_{INT}$ results in a voltage drop of the internal voltage $V_{INT}$, as is shown in the diagram.

If an adjacent bit line is not selected as it is depicted as a floating bit line BL in the diagram, crosstalk might occur between the high voltage level of the selected bit line and the voltage level of the floating bit line, which is in the region of the standby voltage $V_{STBY}$, and the voltage of the floating (or unselected) PMC cell may be higher than the voltage threshold required for programming the unselected PMC cell of the floating bit line. This voltage drop of the floating PMC cell is depicted in FIG. 4 in the bottom diagram. Thus, it may be necessary to set adjacent bit lines to the respective writing voltage corresponding to the stored data of the memory cells of the adjacent bit lines of the selected memory cell during a writing operation. Therefore, if the datum "0" is stored in a first neighboring memory cell corresponding to a high resistive state of the PMC cell of the respective memory cell and the datum "1" is stored in the second neighboring memory cell corresponding to a low resistive state of the PMC cell of the memory cell, a low voltage is applied to the first neighboring bit line of the first neighboring memory cell and a high voltage is applied to the second neighboring bit line of the second neighboring memory cell during a writing operation of the selected memory cell. Forcing the first neighboring bit line of the first neighboring memory cell to a low voltage level prevents or reduces the likelihood of the influence of voltage crosstalk between the selected bit line and the first neighboring bit line during a writing operation of the selected memory cell from causing a programming failure.

While the foregoing is directed to embodiments of the present invention, other and further embodiments of the invention may be devised without departing from the basic scope thereof, and the scope thereof is determined by the claims that follow.

What is claimed is:

1. A method of writing a datum in a memory cell of a conductive bridge random access memory (CBRAM), comprising a plate line, at least three bit lines that are disposed side by side, and at least three memory cells with a programmable metallization cell (PMC) in each of the at least three memory cells, and each of the at least three memory cells is connected to a respective bit line of the at least three bit lines and the plate line, comprising:
    applying to a selected bit line, that is connected to a selected memory cell, a writing voltage for the selected memory cell to write a datum in the selected memory cell to change the resistance value of a selected PMC of the selected memory cell;
    applying to a first neighboring bit line of the selected bit line, wherein the first neighboring bit line is connected to a first neighboring memory cell of the selected memory cell, a writing voltage for the first neighboring memory cell so that data are written in the selected and the first neighboring memory cells during the writing operation of the selected memory cell to reduce voltage crosstalk between the selected bit line and the first neighboring bit line;
    applying to a second neighboring bit line of the selected bit line, wherein the second neighboring bit line is connected to a second neighboring memory cell of the selected memory line, a writing voltage for the second neighboring memory cell, so that data are written in the selected, the first neighboring, and the second neighboring memory cells during the writing operation of the selected memory cell to reduce voltage crosstalk between the selected bit line, the first neighboring bit line, and the second neighboring bit line;
    wherein the voltage on the plate line is lowered when the writing voltage for the selected memory cell is arisen to increase the voltage drop across the selected PMC and to reduce the resistance value of the selected PMC; and
    wherein the voltage of the plate line is lowered to ground voltage.

2. The method of claim 1, wherein the voltage on the plate line is increased when the writing voltage for the selected memory cell is lowered to increase the resistance value of the selected PMC.

3. The method of claim 1, wherein the CBRAM further comprises a writing unit for applying writing and/or reading voltages on the at least three memory cells.

4. The method of claim 3, further comprising, during a read operation:
    applying a read voltage to a selected bit line of a selected memory cell to be read out; and
    applying, to at least one bit line adjacent the selected bit line, a voltage corresponding to a datum stored in a memory cell coupled to the adjacent bit line.

5. The method of claim 1, wherein the CBRAM further comprises an output unit that is connected to a multiplexing unit, connected to the at least three memory cells, for reading out data stored in the at least three memory cells.

6. The method of claim 1, wherein the writing voltages for the first and second neighboring memory cells correspond to the data stored in the first and second neighboring memory cells respectively.

7. A conductive bridge random access memory (CBRAM) circuit, comprising:
    a plate line;
    at least two bit lines that are disposed side by side;
    at least two memory cells, wherein each of the at least two memory cells comprises a programmable metallization cell (PMC) with a solid electrolyte which is adapted to develop or diminish a conductive path depending on the applied electrical field across the PMC, and the each of the at least two memory cells is connected to a bit line of the at least two bit lines and the plate line;
    a writing unit, wherein the writing unit is connected to the at least two bit lines, and is configured to change a resistive state of a selected PMC of a selected memory cell of the at least two memory cells to a programmed or erased state by applying a writing voltage for a selected PMC to a selected bit line of the at least two bit lines and the selected bit line is connected to the selected PMC, comprising a controlling unit, configured to control the writing unit to apply a writing voltage for the select PMC to the selected bit line and to apply a writing voltage for at least one neighboring PMC to at least one neighboring bit line of the selected bit line during the writing operation of the selected memory cell;
    an output unit that is connected with the at least two bit lines for reading out data from the at least two memory cells;
    a voltage unit that is connected with the plate line and is configured to apply a plate voltage to the plate line, wherein the voltage unit is configured to apply a low voltage on the plate line for a programming operation; and
    wherein the low voltage on the plate line for the programming operation is a ground voltage.

8. The CBRAM circuit of claim 7, further comprising:
    a multiplexing unit that is connected to the at least two bit lines and the multiplexing unit is connected to the output unit, wherein the multiplexing unit is configured to connect the selected bit line with the output unit during reading operation.

9. The CBRAM circuit of claim 7, wherein each of the at least two memory cells further comprises a switch, which is connected to the PMC in each of the at least two memory cells.

10. The CBRAM circuit of claim 9, wherein the switch for each of the at least two memory cells is closed during the writing operation of the selected memory cell.

11. The CBRAM circuit of claim 9, wherein the switch for a selected memory cell of the at least two memory cell is opened during a reading operation.

12. The CBRAM circuit of claim 7, wherein the writing unit applies a read voltage, which is lower than the threshold voltage of the selected PMC of the selected memory cell, to a selected memory cell to read out a stored datum in the selected PMC.

13. The CBRAM circuit of claim 7, wherein there are two neighboring bit lines with respective two neighboring memory cells, with one on each side of the selected bit line with the selected memory cell, and the writing unit applies writing voltages for the two neighboring PMCs of the two neighboring memory cells to the two neighboring bit lines during writing operation of the selected memory cell.

14. The CBRAM circuit of claim 7, wherein the writing voltage for the at least one neighboring PMC corresponds to stored datum in the at least one neighboring PMC.

15. A memory circuit, comprising:
a plate line;
at least three bit lines that are disposed side by side;
a word line;
at least three memory cells and each of the at least three memory cell has a programmable metallization cell (PMC) with a solid electrolyte which is adapted to develop or diminish a conductive path depending on the applied electrical field across the PMC, and a switch that is connected to one respective bit of the at least three bit lines, wherein a controlling input of the switch is connected to the word line, a cathode of the PMC is connected to the plate line, and an anode of the PMC is connected to the switch;
a writing unit, wherein the writing unit is connected to the at least three bit lines and is configured to change a resistive state of a selected PMC to a programmed or erased state by applying a writing voltage for a selected PMC to a selected bit line that is connected to the selected PMC and is the middle bit line of the at least three bit lines with one first neighboring bit line on one side and one second neighboring bit line on the other side, comprising a controlling unit, configured to control the writing unit to apply a writing voltage for the select PMC to the selected bit line, to apply a writing voltage for the first neighboring memory cell that is connected to the first neighboring bit line to the first neighboring bit line, and to apply a writing voltage for the second neighboring memory cell that is connected to the second neighboring bit line to the second neighboring bit line during writing operation for the selected PMC; and
wherein the switch for the selected memory cell is opened during a reading operation.

16. The memory circuit of claim 15, further comprising:
an output unit; and
a multiplexing unit that is connected to the at least three bit lines and the multiplexing unit is connected to the output unit, wherein the multiplexing unit is configured to connect the selected bit line with the output unit during reading operation.

17. The memory circuit of claim 15, further comprising:
a voltage unit that is connected with the plate line and is configured to apply a plate voltage to the plate line, wherein the voltage unit is configured to apply a low voltage on the plate line for a programming operation or a high voltage on the plate line for an erasing operation for the selected PMC to assist the programming or erasing operation.

18. The memory circuit of claim 15, wherein the switch for each of the at least three memory cells is closed during a programming or an erasing operation for the selected.

19. The memory circuit of claim 15, wherein applying the writing voltage for the first neighboring memory cell to the first neighboring bit line, whereby the writing voltage corresponding to a stored datum or corresponding to data that should be written in the first neighboring memory cell and applying the writing voltage for the second neighboring memory cell to the second neighboring bit line, whereby the writing voltage corresponding to a stored datum or corresponding to data that should be written in the second neighboring memory cell to reduce voltage crosstalk between the selected bit line, the first neighboring bit line, and the second neighboring bit line.

20. The memory circuit of claim 15, wherein the writing unit applies a read voltage, which is lower than the threshold voltage of the selected PMC of the selected memory cell, to a selected memory cell to read out a stored datum in the selected PMC.

21. A conductive bridge random access memory (CBRAM) circuit, comprising:
a plate line;
at least two bit lines that are disposed side by side;
at least two memory cells, wherein each of the at least two memory cells comprises a programmable metallization cell (PMC) with a solid electrolyte which is adapted to develop or diminish a conductive path depending on the applied electrical field across the PMC, and the each of the at least two memory cells is connected to a bit line of the at least two bit lines and the plate line;
a writing unit, wherein the writing unit is connected to the at least two bit lines, and is configured to change a resistive state of a selected PMC of a selected memory cell of the at least two memory cells to a programmed or erased state by applying a writing voltage for a selected PMC to a selected bit line of the at least two bit lines and the selected bit line is connected to the selected PMC, comprising a controlling unit, configured to control the writing unit to apply a writing voltage for the select PMC to the selected bit line and to apply a writing voltage for at least one neighboring PMC to at least one neighboring bit line of the selected bit line during the writing operation of the selected memory cell, wherein the writing voltage for the at least one neighboring PMC corresponds to the data stored in the at least one neighboring PMC;
an output unit that is connected with the at least two bit lines for reading out data from the at least two memory cells;
wherein each of the at least two memory cells further comprises a switch, which is connected to the PMC in each of the at least two memory cells; and
wherein the switch for a selected memory cell of the at least two memory cell is opened during a reading operation.

22. A method of writing a datum in a memory cell of a conductive bridge random access memory (CBRAM), comprising a plate line, at least three bit lines that are disposed side by side, and at least three memory cells with a programmable metallization cell (PMC) in each of the at least three memory cells, and each of the at least three memory cells is connected to a respective bit line of the at least three bit lines and the plate line, comprising:
applying to a selected bit line, that is connected to a selected memory cell, a writing voltage for the selected memory cell to write a datum in the selected memory cell to change the resistance value of a selected PMC of the selected memory cell;
applying to a first neighboring bit line of the selected bit line, wherein the first neighboring bit line is connected to a first neighboring memory cell of the selected memory cell, a writing voltage for the first neighboring memory cell so that data are written in the selected and the first neighboring memory cells during the writing operation of the selected memory cell to reduce voltage crosstalk between the selected bit line and the first neighboring bit line;
applying to a second neighboring bit line of the selected bit line, wherein the second neighboring bit line is connected to a second neighboring memory cell of the selected memory line, a writing voltage for the second neighboring memory cell, so that data are written in the selected, the first neighboring, and the second neighboring memory cells during the writing operation of the selected memory cell to reduce voltage crosstalk between the selected bit line, the first neighboring bit line, and the second neighboring bit line; and wherein the writing voltages for the first and second neighboring memory cells correspond to the data stored in the first and second neighboring memory cells respectively.

23. A method of writing a datum in a memory cell of a conductive bridge random access memory (CBRAM), comprising a plate line, at least three bit lines that are disposed side by side, and at least three memory cells with a programmable metallization cell (PMC) in each of the at least three memory cells, and each of the at least three memory cells is connected to a respective bit line of the at least three bit lines and the plate line, comprising:

applying to a selected bit line, that is connected to a selected memory cell, a writing voltage for the selected memory cell to write a datum in the selected memory cell to change the resistance value of a selected PMC of the selected memory cell;

applying to a first neighboring bit line of the selected bit line, wherein the first neighboring bit line is connected to a first neighboring memory cell of the selected memory cell, a writing voltage for the first neighboring memory cell so that data are written in the selected and the first neighboring memory cells during the writing operation of the selected memory cell to reduce voltage crosstalk between the selected bit line and the first neighboring bit line;

applying to a second neighboring bit line of the selected bit line, wherein the second neighboring bit line is connected to a second neighboring memory cell of the selected memory line, a writing voltage for the second neighboring memory cell, so that data are written in the selected, the first neighboring, and the second neighboring memory cells during the writing operation of the selected memory cell to reduce voltage crosstalk between the selected bit line, the first neighboring bit line, and the second neighboring bit line;

wherein the CBRAM further comprises a writing unit for applying writing and/or reading voltages on the at least three memory cells;

applying a read voltage to a selected bit line of a selected memory cell to be read out; and applying, to at least one bit line adjacent the selected bit line, a voltage corresponding to a datum stored in a memory cell coupled to the adjacent bit line.

* * * * *